(12) United States Patent
Albrecht et al.

(10) Patent No.: US 7,648,641 B2
(45) Date of Patent: Jan. 19, 2010

(54) METHOD AND APPARATUS FOR CREATING A TOPOGRAPHICALLY PATTERNED SUBSTRATE

(75) Inventors: Thomas Robert Albrecht, San Jose, CA (US); Henry Hung Yang, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 535 days.

(21) Appl. No.: 11/155,099

(22) Filed: Jun. 17, 2005

(65) Prior Publication Data
US 2006/0286368 A1      Dec. 21, 2006

(51) Int. Cl.
*B44C 1/22*          (2006.01)

(52) U.S. Cl. .............. 216/72; 216/41; 216/79; 430/300; 430/312

(58) Field of Classification Search .......... 214/41, 214/79, 99; 430/312, 314, 300; 216/41, 216/72, 79, 99
See application file for complete search history.

(56) References Cited

U.S. PATENT DOCUMENTS

| | | | |
|---|---|---|---|
| 4,082,453 A | 4/1978 | Knop | 355/88 |
| 5,259,926 A | 11/1993 | Kuwabara et al. | 156/659 |
| 5,512,131 A | 4/1996 | Kumar et al. | 156/655 |
| 5,772,905 A | 6/1998 | Chou | 216/44 |
| 6,518,194 B2 | 2/2003 | Winningham et al. | 438/717 |
| 6,748,865 B2 | 6/2004 | Sakurai et al. | 101/483 |
| 6,753,130 B1 | 6/2004 | Liu et al. | 430/313 |
| 7,354,698 B2* | 4/2008 | Van Santen et al. | 430/311 |
| 2003/0082485 A1 | 5/2003 | Bulthaup et al. | 430/312 |
| 2003/0205657 A1 | 11/2003 | Voisin | |
| 2004/0005444 A1 | 1/2004 | Heidari | 428/212 |
| 2005/0146079 A1* | 7/2005 | Chou | 264/319 |
| 2005/0186405 A1* | 8/2005 | Jeong et al. | 428/209 |
| 2006/0144275 A1* | 7/2006 | Kolesnychenko et al. | 101/483 |

FOREIGN PATENT DOCUMENTS

JP        2004066447        3/2004

OTHER PUBLICATIONS

L Jay Guo, "Recent progress in nanoimprint technology and its applications," Journal of Physics D: Applied Physics 37(2004) R123-R141.
Chung-yen Chao and L. Jay Guo, "Polymer microring resonators fabricated by nanoimprint technique," J. Vac. Sci. Technol. B 20(6), Nov./Dec. 2002 2862-2866.
Japanese Office Action, Chines Patent Application No. 200610093759.4, Jan. 16, 2009.

* cited by examiner

*Primary Examiner*—Lan Vinh
(74) *Attorney, Agent, or Firm*—Kunzler & McKenzie

(57) ABSTRACT

A method of the present invention is presented for deep etching of features on a surface. In one embodiment, the method includes providing a substrate having a surface selected to undergo a feature etching process and coating the substrate surface with a protective layer and an imprintable layer. The coated substrate is then subjected to a feature imprinting and etching process. Subsequent to the feature etching process, exposed portions of the protective layer are removed, exposing a well-defined, topographically patterned substrate. In addition, an apparatus for undergoing a feature etching process is disclosed. The apparatus comprises a substrate, an imprintable layer selected to undergo an imprinting process, and a protective layer positioned between the substrate and the imprintable layer. The protective layer may be selected to provide additional protection to selected portions of the substrate and to prevent non-planar byproducts of the feature etching process from transferring to the selected portions.

30 Claims, 4 Drawing Sheets

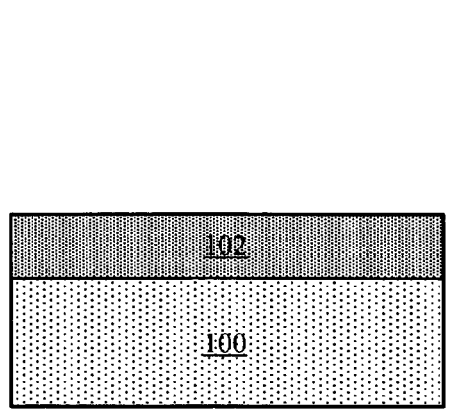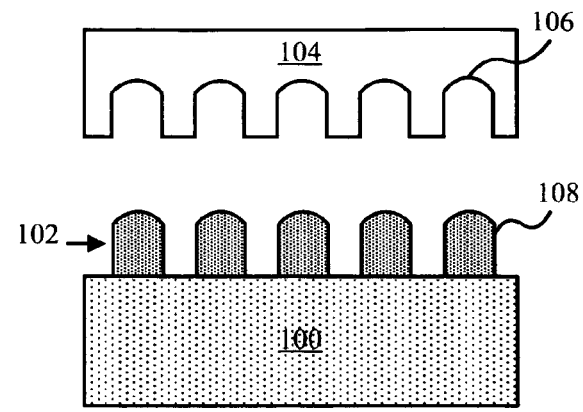
Fig. 1A    Fig. 1B
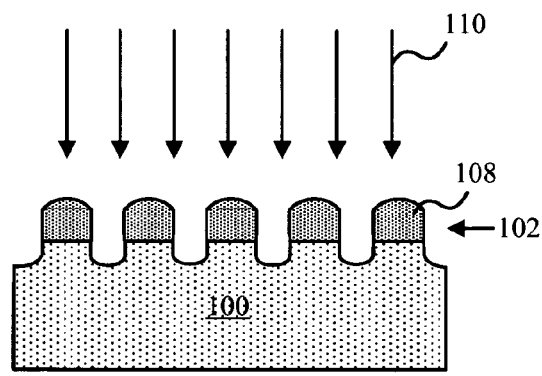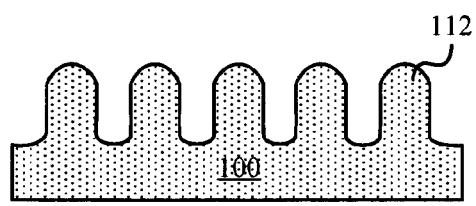
Fig. 1C    Fig. 1D
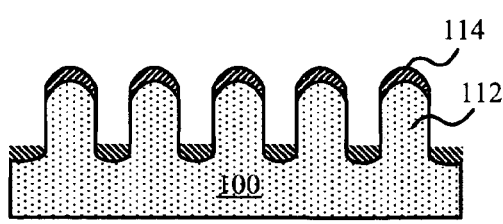
Fig. 1E
(Prior Art)

METHOD AND APPARATUS FOR CREATING A TOPOGRAPHICALLY PATTERNED SUBSTRATE

BACKGROUND OF THE INVENTION

1. Field of the Invention

This invention relates to surfaces patterned by imprint lithography and more particularly relates to methods and apparatus for creating topographically patterned substrates such as those used for patterned magnetic media.

2. Description of the Related Art

Traditionally, the storage capacity and the areal density of magnetic storage media have been limited by certain restraints such as material characteristics, manufacturing processes, metrological limitations, and the like. For example, conventional multigrain magnetic media is generally created by covering a flat substrate with a thin layer of magnetic alloy that forms clusters of atoms on the substrate surface known as grains. Each grain operates as a partially independent unit of magnetization subject to influence from other grains.

Data may be stored in tracks comprised of regions of alternating magnetic polarity. To increase data storage density, tracks may be made narrower, or the length of the regions of alternating polarity along the track may be reduced. Shrinking these dimensions generally requires that the size of the random grains in the media be reduced, so that sharp boundaries and sharp track edge boundaries can be defined by the magnetic write head. If grains are too large, the signal to noise ratio of the recording system suffers, and data errors are generated at an unacceptable rate. On the other hand, if the grains are too small, they may become unstable from thermally induced vibrations and spontaneously reverse their magnetic polarity (leading to loss of stored data) in a process known as the superparamagnetic effect. As a result of the superparamagnetic effect, the areal density of stable storage media has typically been restricted to around 150 Gbit/in$^2$ for conventional multigrain magnetic recording media.

Recently, patterned media has been proposed as a growth path for increased density and capacity with good thermal stability. With patterned media, a highly ordered array of magnetic islands is formed on a surface. Due to their physical separation and reduced magnetic coupling to one another, the magnetic islands function as individual magnetic units, comprised either of single grains, or a collection of strongly-coupled grains within each island. Since these magnetic islands are larger than the individual grains in conventional media, their magnetization is thermally stable. High density is achieved by storing data in tracks just one island wide, rather than having to be wide enough to accommodate multiple (typically on the order of 10) random grains.

Patterned media can be formed by a variety of methods known to those skilled in the art. One method used to produce topographically patterned substrates is called imprint (or "nanoimprint") lithography. While imprint lithography enables the formation of small features on a substrate, reduced surface flatness often occurs during island formation. The flatness of the media surface affects the head-media spacing, which directly affects the performance and storage capacity of the storage media. It is necessary to produce island features that are both sufficiently tall to provide magnetic isolation and have a sufficiently flat top to provide good head-media spacing control.

FIGS. 1A-1E depict a series of cross-sectional side views of a substrate 100 subjected to a prior art imprint lithography process. Imprint lithography processes such as thermal or UV-cure imprint lithography typically involve the formation of a topography in a resist layer 102 by pressing a topographically-patterned imprint master 104 against a resist-coated substrate 100 (FIG. 1A). In thermal imprinting, either the master 104, the sample substrate 100, or both, are heated to soften the resist 102 during the imprinting process. Upon cooling, the imprinted resist patterns or features 108 solidify and retain their imprinted shape after removal of the master 104 (FIG. 1B). In UV-cure imprinting, a transparent master 104 is pressed against a substrate 100 coated with a liquid photopolymer resist 102. After exposure to UV light through the master 104, the resist 102 polymerizes into a solid, leaving solidified topographic features 108 in the cured resist layer 102.

Due to limitations in the creation of the master 104 and in the nanoimprinting process itself, features 108 typically have some corner rounding. For patterns with very small (nm scale) features 108, such as the patterns used to create islands on patterned magnetic media, corner rounding may comprise a large fraction of the total feature area. The rounded shape in the resist features 108 can have detrimental effects on the subsequent pillar 112 formation in the substrate 100.

To form the desired features 108 in the substrate 100, the substrate 100 and the imprintable layer 102 may be exposed to ions 110 (FIG. 1C) during a directional etch process such as Reactive Ion Etching (RIE). The ions 110 combine with the material of the imprintable resist layer 102 and the substrate 100 and may form an uncharged gas which is pumped out of the etching chamber, leaving an etched pattern in the substrate 100. The imprintable resist layer 102 typically etches at a rate close to that of the substrate 100, resulting in the formation of rounded pillars 112 in the substrate 100 if the patterns are etched deeply into the substrate 100 (FIG. 1D). In addition, the imprintable resist layer 102 may subject to sidewall erosion during the etch process resulting in additional rounding of the pillars 112 of the substrate 100. Rounded pillars 112 in the substrate 100 cause several problems that can hinder the read/write process and prevent substantial improvements in storage media technology.

One problem arises when a magnetic layer 114 (FIG. 1E) is deposited over the surface of the substrate 100 to coat the tops of the pillars 112. Because the tops of the pillars 112 are rounded, the magnetic layer 114 is generally rounded as well. The resulting uneven surface negatively affects the head-media spacing, thereby reducing the effectiveness of the storage device.

Although the edge-rounding effect can be reduced by reducing the etch depth into the substrate 100, doing so may result in substrate pillars 112 with insufficient height to provide the needed magnetic isolation in the finished storage media. Another solution for reducing rounding would appear to be the use of higher aspect ratio (taller) resist patterns. Unfortunately, it is technically challenging to produce high aspect ratio features in the desired size range by nanoimprint lithography.

In one embodiment, the pillars 112 are approximately 20-30 nm in diameter. As a result of the etching process described above, rounding can create sloped edges that are approximately 5-10 nm in width, which significantly reduces the diameter of the desirable flat area at the top of each pillar 112. Although the flat area on a pillar 112 can always be increased by increasing the overall diameter of the pillar 112, larger pillars 112 result in low pillar density, which correspondingly reduces magnetic island density and data storage capacity for the finished magnetic storage media. Thus, a solution is needed to prevent the rounded edges of patterns in the resist 102 from being transferred to the etched pillar 112 of the substrate 100.

From the foregoing discussion, it should be apparent that a need exists for an apparatus and method that create a topographically patterned substrate that retains a flat surface without rounding of the features formed thereon. Beneficially, such a method and apparatus would reduce magnetic coupling between domains, increase the effective area sensitive to corresponding read/write mechanisms, and minimize the height requirements for movement mechanisms, thus improving the possible storage density, signal-to-noise ratio, and overall performance of a storage device.

SUMMARY OF THE INVENTION

The present invention has been developed in response to the present state of the art, and in particular, in response to the problems and needs in the art that have not yet been fully solved by currently available patterned magnetic media. Accordingly, the present invention has been developed to provide a method and apparatus for creating a topographically patterned substrate that overcome many or all of the above-discussed shortcomings in the art.

A method of the present invention is presented for deep etching of features on a surface. In one embodiment, the method includes providing a substrate having a surface selected to undergo a feature etching process and coating the substrate surface with a protective layer and an imprintable layer. The imprintable layer may be selected to undergo an imprinting process and to protect selected portions of the substrate during the feature etching process. The protective layer, which may be disposed between the substrate and the imprintable layer, may be selected to erode during the feature etching process such that the protective layer continues to cover selected portions of the substrate after the feature etching process. In one embodiment, the feature etching process involves a protective layer etch step and a substrate etch step in order to increase etching selectivity and the depth attainable by the feature etching process.

The method may include conducting the feature etching process and then removing remaining portions of the protective layer, thereby creating a flat, topographically patterned substrate without rounded edges. In certain embodiments, the substrate is made from a material selected from the group consisting of Si, $Si_3N_4$, and $SiO_2$. The protective layer may be selected from the group consisting of $SiO_2$, Ti, PVA, W, Al2O3, polyimide, and photoresist. The etch resistance of the protective layer may be less than etch resistance of the imprintable layer. Preferably, the etch resistance of the protective layer is less than the etch resistance of the imprintable layer but greater than the etch resistance of the substrate.

In one embodiment, the thickness of the protective layer may be substantially determined by an equation $T_{pro}=R*S+BV*S$, wherein R is the rounding that occurs in the imprintable layer, BV is the base layer variance of the imprintable layer, and S is the etch selectivity of the imprintable layer and the protective layer and $T_{pro}$ is the thickness of the protective layer. The thickness of the protective layer may determine the amount of protection provided to the surface of the substrate during the feature etching process. In certain embodiments, the thickness and the etch resistance of the protective layer are selected such that non-planar byproducts of the feature etching process are not transferred to the selected protected portions of the substrate.

In certain embodiments, the method may further comprise coating the substrate with a magnetic layer subsequent to removing remaining portions of the protective layer in order to form a patterned magnetic media. The patterned magnetic media may be incorporated in a storage device such as a disk drive.

An apparatus of the present invention, in one embodiment, is configured to undergo a feature etching process. The apparatus comprises a substrate, an imprintable layer selected to undergo an imprinting process, and a protective layer positioned between the substrate and the imprintable layer. The protective layer may be selected to provide additional protection to selected portions of the substrate during the feature etching process.

In certain embodiments, the protective layer may be substantially non-imprintable and may have greater erosion resistance to the feature etching process than the substrate. In one embodiment, the protective layer comprises a material that can be selectively removed from the substrate by undergoing an additional process step. The apparatus may further comprise a magnetic layer configured to coat the substrate after undergoing the feature etching process.

The present invention increases the flatness of substrates with deeply etched features. Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIGS. 1A-1E are a set of cross-sectional side views of a substrate illustrating a prior art lithographic imprint process used to create patterned magnetic media;

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided to give a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 2:
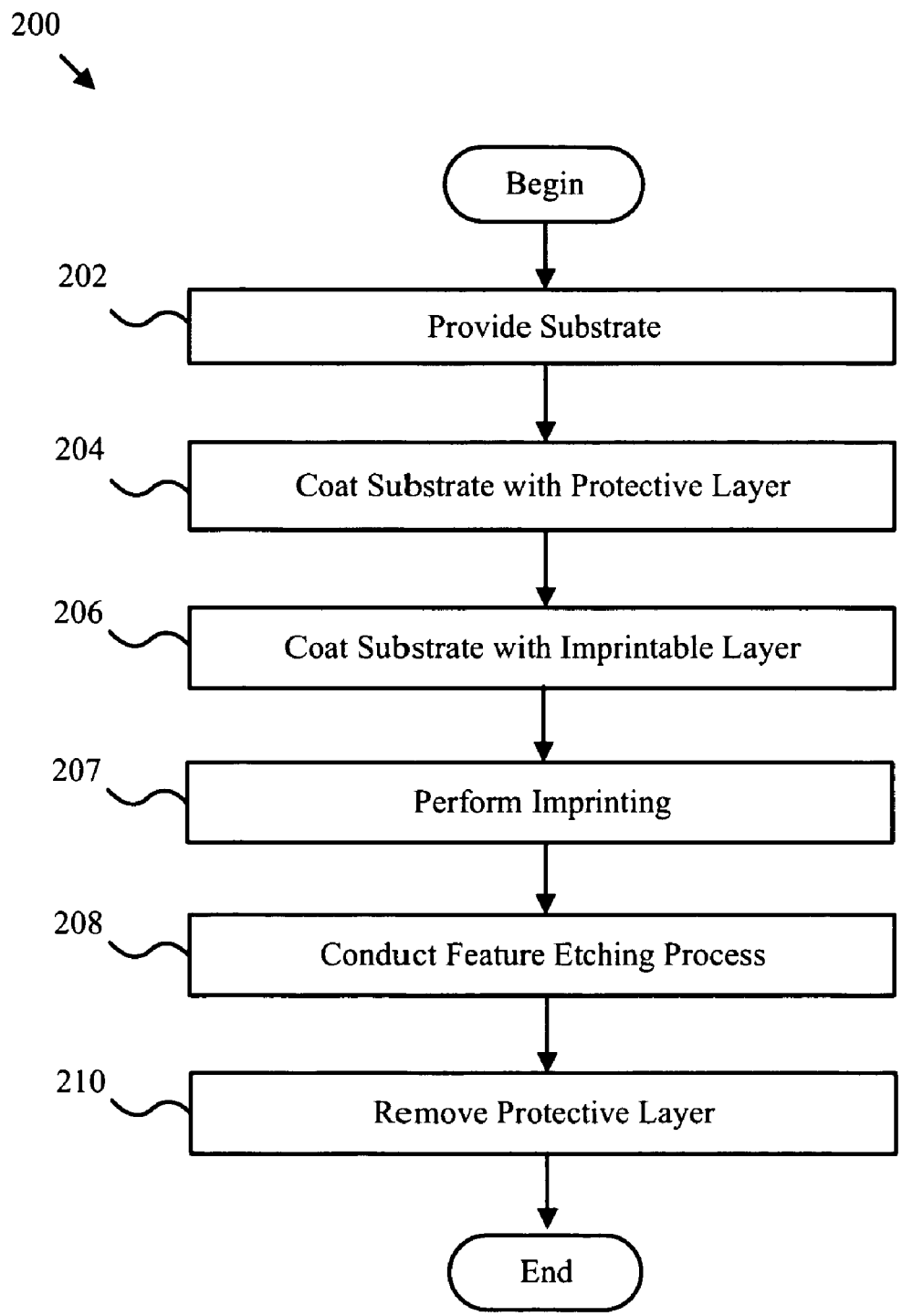
FIG. 2 is a schematic flow chart diagram illustrating one embodiment of a feature formation method of the present invention.

FIG. 2 is a schematic flow chart diagram illustrating one embodiment of a feature formation method 200 of the present invention. As depicted, the method 200 includes providing 202 a substrate, coating 204 the substrate with a protective layer, coating 206 the substrate with an imprintable layer, performing 207 an imprinting step, conducting 208 a feature etching process, and removing 210 remaining portions of the protective layer. In certain embodiments, the patterned substrate may then be coated with a magnetic layer to form a magnetic media. The method 200 will be discussed in greater detail in conjunction with FIGS. 3A-3F.

FIGS. 3A-3F are a set of cross-sectional side views of a substrate 300 undergoing a feature etching process. The substrate 300 may be provided 202 and coated 204 with a protective layer 302. An imprintable layer 102 may further coat 206 the substrate 300 and may be applied on top of the protective layer 302, positioning the protective layer 302 between the substrate 300 and the imprintable layer 102.

The surface of the substrate 300 may be substantially flat to enhance the performance of a storage media device. The protective layer 302 preferably protects and preserves the flatness of the surface of the substrate 300. Additionally, the substrate 300 may be a material selected to undergo a feature etching process and may be selected from a group consisting of Si, $Si_3N_4$, and $SiO_2$, though the substrate 300 is not limited to these materials. Those of skill in the art will recognize that various materials, etching processes, and combinations thereof may be selected to create a patterned substrate 300.

The protective layer 302 may be substantially non-imprintable and may be selected to have less erosion resistance to the feature etching process than the imprintable layer 102. The protective layer 302 may be configured to erode during the feature etching process such that the protective layer 302 continues to cover the selected portions of the substrate 300 after the feature etching process. Consequently, the protective layer 302 prevents the substrate 300 from receiving rounded features, non-planar byproducts during imprinting and etching processes. The protective layer 302 is also chosen to be selectively and completely removable from the substrate 300 without etching or otherwise damaging the substrate 300. In certain embodiments, the protective layer 302 may be selected to undergo a multi-step etching process that facilitates efficient removal of the exposed portions of the protective layer 302 followed by efficient etching of the substrate 300. In another embodiment, the protective layer 302 is capable of being etched by the same feature etching process that etches the surface of the substrate 300, and may have a lower etch rate.

The etch resistance of the protective layer 302 may be less than the etch resistance of the imprintable layer. Furthermore, the thickness and the etch resistance of the protective layer 302 may be selected such that non-planar byproducts of the feature etching process are not transferred to the selected portions of the substrate 300, thus overcoming the problems and shortcomings associated with conventional feature formation methods.

Those of skill in the art will recognize and appreciate that the protective layer 302 provides additional flexibility and options in the feature etching process. For example, the material of the protective layer 302 and the substrate 300 may be selected based on a variety of factors, such as the desired outcome, the chosen feature etching process, the etch rate of the imprintable layer 102, and the like.

During imprinting, the imprintable layer 102 receives the imprint master 104 as explained above (See FIG. 1B). A selected pattern with pillars 108 may be formed on the surface of the protective layer 302 to protect portions of the substrate 300 during the feature etching process. In one embodiment, the imprintable layer 102 comprises a nanoimprint resist which is liquid at room temperature or a solid which is softened by heating during the imprinting step 207. Consequently, the imprinted pattern may be transferred to the imprintable layer 102.

A feature etching process may then be conducted 208 to create a patterned surface on the substrate 300. In one embodiment, a single directional etch such as a reactive ion etch (FIG. 3C) is conducted using ions 110 to remove selected portions of the imprintable layer 102, the protective layer 302, and the substrate 300. The single etching process may be designed to erode the substrate 300 and the layers 302, 102 at specifically different rates in order to optimize the quality of the features formed in the substrate 300. In one embodiment, any remaining residual layer 303 of the imprintable layer 102 is removed with a separate etching step before etching the protective layer 302, to ensure that a uniform etch depth is achieved regardless of surface variation of residual layer of the imprintable layer 102.

In some embodiments, the substrate 300 and its corresponding layers 302, 102 may be subjected to a feature etching process comprising one or more etching episodes to produce a patterned substrate 300. In certain embodiments, a first etching episode may be used to etch the protective layer 302. Accordingly, a second etching episode may be selected to etch the substrate 300. In one embodiment, the imprintable layer 102 is only required to be thick enough to facilitate etching through the protective layer 302 and the protective layer 302 protects the substrate 300 while the surface features are etched therein. Under such a scenario, less erosion and rounding of the imprintable layer 102 may occur. Reducing the rounding of the imprintable layer 102 by making the imprintable layer 102 thinner and etching it for a shorter time, may improve the attainable depth of the etching process.

Figures 3A, 3B:
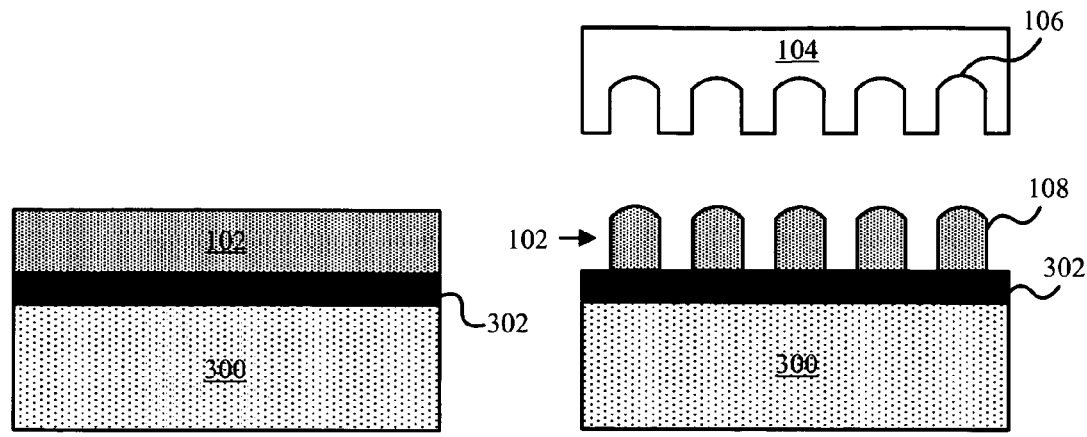
FIGS. 3A-3F are a set of cross-sectional side views of a substrate illustrating the feature formation method of FIG. 2 and a feature formation apparatus associated therewith.
Figures 3C, 3D:
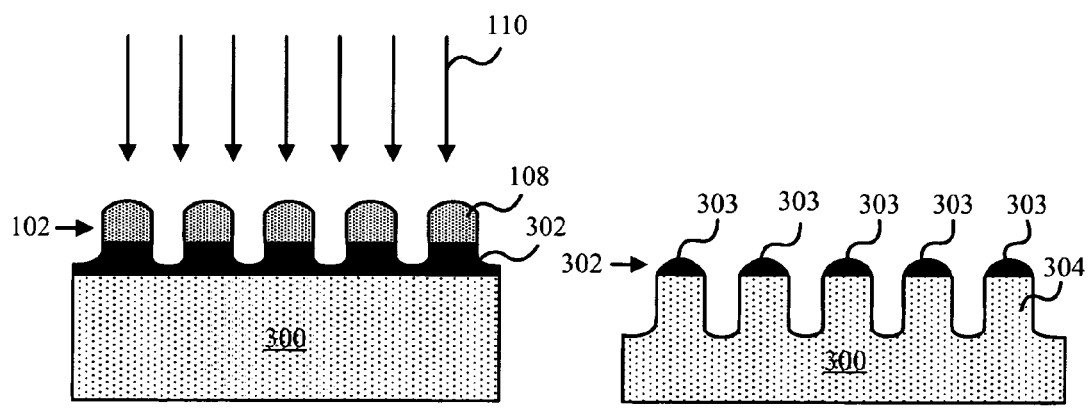

The protective layer 302 adds additional freedom and flexibility to the etching process. Those of skill in the art will appreciate the variety of configurations of layers and etching processes that may be used in conjunction with the protective layer 302 to produce a well-defined, patterned substrate 300. The rounding typical to imprint lithography is preferably confined to the imprintable layer 102 and the protective layer 302 and is not passed on to the substrate 300 (FIG. 3D). The remaining rounded portions of the protective layer 302 are referred to herein as non-planar byproducts 303. Preferably, the non-planar byproducts 303 are selected with a thickness and etch resistant rate that ensures that the non-planar byproducts 303 cover the pillars 304, also referred to as selected portions, formed by the etching process(es). As a result, the protective layer 302 may be removed 210 from the substrate 300, leaving a substantially flat surface on the substrate 300 and pillars 304 with well-defined edges (FIG. 3E).

In certain embodiments, a separate removal process may remove the protective layer 302, such as a wet etch. Alternatively, another directional etch such as RIE may remove the protective layer 302, depending on the selected material of the protective layer 302. An aspect of the various embodiments is that the protective layer 302 may be selectively removed from the substrate 300 without affecting the surface of the substrate 300. Suitable materials for the protective layer 302 may include, but are not limited to, $SiO_2$, Ti, PVA, W, Al2O3, polyimide, and photoresist. In one embodiment, a feature etching process to pattern the substrate 300 and a protective layer 302 removal process are performed in succession in the same processing device. Alternatively, the protective layer 302 may be removed 210 in a separate process as desired.

Table 1 illustrates various examples of materials that may be used for the substrate 300, and corresponding materials that may be suitable for the feature etching process, the protective layer 302, and the removal of the protective layer 302. The examples are given for illustrative purposes only, and therefore, are not intended to be limiting of the scope of the invention.

Figures 3E, 3F:
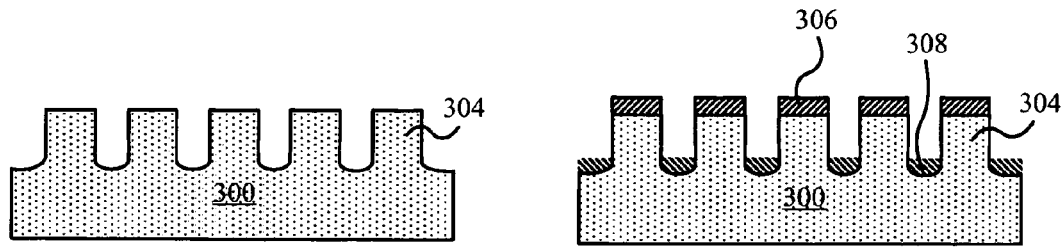

In certain embodiments, subsequent to removal of the protective layer 302, a magnetic layer 306 may further be deposited over the surface of the substrate 300 in order to create a patterned magnetic media (FIG. 3F). In one embodiment, the magnetic layer 306 is blanket-deposited over the entire surface of the patterned substrate 300, coating the tops of the pillars 304 and settling into the recesses 308. A magnetically coated pillar 304 consequently becomes an independent magnetic island that comes into close range with a read/write head of a storage device. The flat, well-defined surface of the substrate 300 improves the overall performance of the magnetic media and enables improvements in the relative art, such as greater storage densities and signal-to-noise ratios. The magnetic media may be included in a storage device such as a disk drive.

TABLE 1

| Substrate Material | RIE Chemistry | Protective Layer | Prot. Layer Removal |
|---|---|---|---|
| Si, $Si_3N_4$ | $CHF_3$, $CF_4$, or $SF_6$ | $SiO_2$ | wet HF |
| Si, $Si_3N_4$ | $CHF_3$, $CF_4$, or $SF_6$ | Ti | wet HF |
| Si, $Si_3N_4$, $SiO_2$ | $CHF_3$, $CF_4$, or $SF_6$ | PVA | water |
| Si, $Si_3N_4$, $SiO_2$ | $CHF_3$, $CF_4$, or $SF_6$ | W | wet $H_2O_2$ (hydrogen peroxide) |
| Si, $Si_3N_4$ | $CHF_3$, $CF_4$, or $SF_6$ | $Al_2O_3$ (alum. oxide) | wet HF |
| Si, $Si_3N_4$, $SiO_2$ | $CHF_3$, $CF_4$, or $SF_6$ | polymide | $O_2$ RIE |
| Si, $Si_3N_4$, $SiO_2$ | $CHF_3$, $CF_4$, or $SF_6$ | Photoresist | wet PGMEA or wet NMP |

In order to provide a protective layer 302 that beneficially protects the surface of the substrate 300 from rounding, an equation may be used, in certain embodiments, to substantially determine an appropriate thickness for the protective layer 302. Those of skill in the art will recognize that other embodiments, such as those involving multi-episode etching processes, may benefit from alternative configurations. The following equation may be based on the characteristic properties of an imprintable layer 102 and a selected material for the protective layer 302.

$$T_{pro} = R*S + BV*S \quad \text{Equation 1}$$

The thickness of the protective layer 302 may be partially determined by the etch selectivity, S, of the imprintable layer 102 and the protective layer 302. The etch rates for different materials can vary drastically, and the various layer materials and thicknesses may be determined accordingly. Selectivity is the ratio of the etch rates of the layers involved in etching as shown in Equation 2.

$$S = \text{(Etch Rate of Imprintable Layer)}/\text{(Etch Rate of Protective Layer)} \quad \text{Equation 2}$$

The shape, or the degree of rounding, R, that occurs in the imprintable layer 102 may also facilitate determining an adequate thickness of the protective layer 302. Because rounding of the imprintable layer 102 may reflect rounding that occurs in the protective layer 302 (FIG. 3D), the protective layer 302 is preferably thick enough to prevent rounding from affecting or being transferred to the substrate 300.

Figure 4:
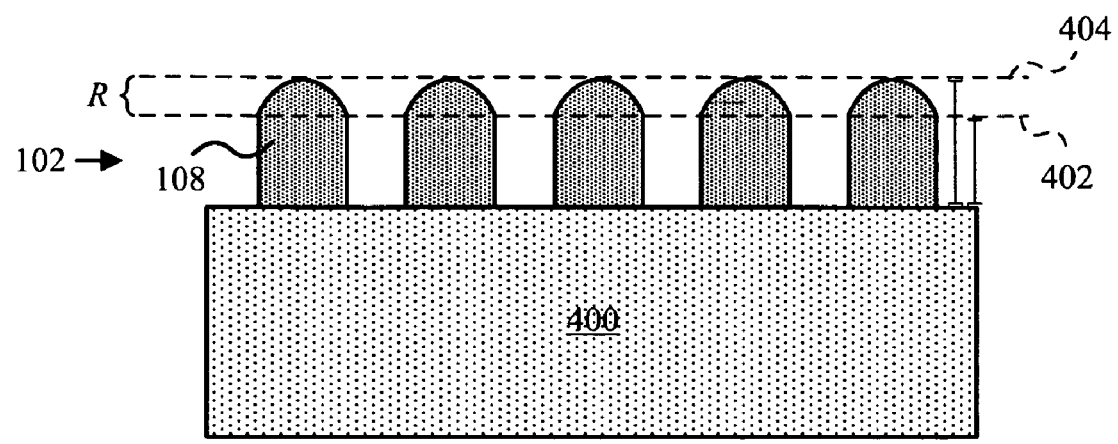
FIG. 4 is a cross-sectional side view of a substrate illustrating a rounding metric useful for optimizing one embodiment of the feature formation method of the present invention.

FIG. 4 is a cross-sectional side view of a substrate 400 illustrating rounding in the imprintable layer 102 (See also FIG. 1B). Rounding is determined by subtracting the thickness of the edge 402 from the thickness of the center 404. In the depicted scenario, rounding is the thickness of the curved portion (See FIG. 3D, non-planar byproducts 303) of the pillars 108 as captured in Equation 3.

$$R = \text{(Thickness of Center of Imprint Layer)} - \text{(Thickness of Edge of Imprint Layer)} \quad \text{Equation 3}$$

In addition, residual (or "base") layer variance, BV, in the imprintable layer 102 may further facilitate determining a protective layer thickness. Residual layer variance often occurs during imprint lithography when the imprint master 104 (FIG. 1B) forms a pattern in the imprintable layer 102. Limitations in the flow of the resist during the imprint process, curvature of either the master or the substrate, and/or slight angular misalignment may create a thin residual layer that covers the surface of the substrate 100 over all or part of the patterned substrate.

Figure 5:
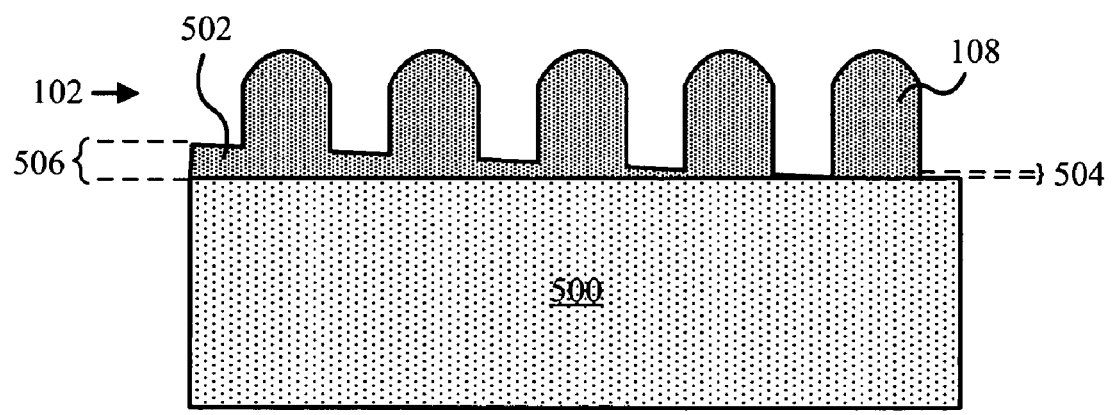
FIG. 5 is a cross-sectional side view of a substrate illustrating an imprint residual metric useful for optimizing one embodiment of the feature formation method of the present invention.

FIG. 5 is a cross-sectional side view of a substrate 500 illustrating a residual layer 502 of the imprintable layer 102. In the depicted illustration, the variance of the residual layer 502 can be determined by subtracting the minimum thickness 504 from the maximum thickness 506 of the residual layer 502. Thus, the protective layer 302 may be thick enough to compensate for irregularities in the residual layer 506.

$$BV = \text{(Max. Thickness of Residual Layer)} - \text{(Min. Thickness of Residual Layer)} \quad \text{Equation 4}$$

Consequently, a thickness for the protective layer 302 may be substantially determined by the equation $T_{pro} = R*S + BV*S$. As a result, rounding during the feature etch process (See FIG. 3D, non-planar byproducts 303) may occur in the protective layer 302, preserving the flat surface of the substrate 300. The rounded protective layer 302 may then be removed, leaving a well-defined, patterned substrate 300.

The present invention facilitates deep etching of features while preserving surface flatness. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for deep etching features on a surface, the method comprising:
   providing a substrate having a surface selected to undergo a feature etching process;
   coating the substrate surface with a protective layer and an imprintable layer, the imprintable layer selected to undergo an imprinting process and to protect selected portions of the protective layer during the feature etching process, the protective layer disposed between the substrate and the imprintable layer, the protective layer comprising a material having less erosion resistance to the feature etching process than a material comprising the imprintable layer such that the protective layer erodes at a rate faster than an erosion rate for the imprintable layer during the feature etching process, wherein the protective layer is configured to erode during the feature etching process, and wherein the imprintable layer protects the protective layer such that the protective layer continues to cover the selected portions of the substrate after the feature etching process; and
   wherein the imprintable layer is substantially removed subsequent to the feature etching process, wherein the protective layer remains covering the selected portions of the substrate subsequent to the feature etching process.

2. The method of claim 1, further comprising conducting the feature etching process.

3. The method of claim 1, wherein the feature etching process comprises a first etching episode selected to etch the protective layer and a second etching episode selected to etch the substrate.

4. The method of claim 1, further comprising removing exposed portions of the protective layer.

5. The method of claim 1, wherein the protective layer is made from a material selected from the group consisting of $SiO_2$, Ti, PVA, W, Al2O3, polyimide, and photoresist.

6. The method of claim 1, wherein a thickness of the protective layer is substantially determined by an equation $T_{pro}R*S+BV*S$, wherein R is a rounding that occurs in the imprintable layer, BV is a residual layer variance of the imprintable layer, and S is an etch selectivity of the imprintable layer and the protective layer.

7. The method of claim 1, further comprising coating the substrate with a magnetic layer subsequent to removing remaining portions of the protective layer.

8. The method of claim 7, further comprising incorporating a patterned magnetic media formed by the method of claim 7 within a storage device.

9. The method of claim 1, further comprising completely removing remaining portions of the protective layer subsequent to conducting the feature etching process.

10. The method of claim 9, wherein the protective layer is removed by performing a removal process selected to remove the protective layer without affecting the surface of the substrate.

11. The method of claim 10, wherein the substrate is made from a material selected from the group consisting of Si, $Si_3N_4$, and $SiO_2$.

12. A method for deep etching features on a surface, the method comprising:
    providing a substrate having a surface selected to undergo a feature etching process;
    coating the substrate surface with a protective layer and an imprintable layer, the imprintable layer selected to undergo an imprinting process and to protect selected portions of the substrate during the feature etching process, the protective layer disposed between the substrate and the imprintable layer, wherein the protective layer is configured to erode during the feature etching process such that the protective layer continues to cover the selected portions of the substrate after the feature etching process, the protective layer coating the substrate surface at a thickness selected such that the selected portions of the substrate remain covered subsequent the feature etching process; and
    wherein the selected thickness of the protective layer is a function of an etch rate of the imprintable layer divided by an etch rate of the protective layer, the result multiplied by a difference between a thickness of the center of an imprinted imprint layer and a thickness of the edge of the imprinted imprint layer.

13. The method of claim 12, wherein the feature etching process comprises a first etching episode selected to etch the protective layer and a second etching episode selected to etch the substrate.

14. The method of claim 12, further comprising completely removing remaining portions of the protective layer subsequent to conducting the feature etching process.

15. The method of claim 14, wherein the protective layer is removed by performing a removal process selected to remove the protective layer without affecting the surface of the substrate.

16. A method for deep etching features on a surface, the method comprising:
    providing a substrate having a surface selected to undergo a feature etching process;
    coating the substrate surface with a protective layer and an imprintable layer, the imprintable layer selected to undergo an imprinting process and to protect selected portions of the substrate during the feature etching process, the protective layer disposed between the substrate and the imprintable layer, wherein the protective layer is configured to erode during the feature etching process such that the protective layer continues to cover the selected portions of the substrate after the feature etching process; and
    wherein a thickness of the protective layer is substantially determined by an equation $T_{pro}R*S+BV*S$, wherein R is a rounding that occurs in the imprintable layer, BV is a residual layer variance of the imprintable layer, and S is an etch selectivity of the imprintable layer and the protective layer.

17. The method of claim 16, further comprising completely removing remaining portions of the protective layer subsequent to conducting the feature etching process.

18. The method of claim 17, wherein the protective layer is removed by performing a removal process selected to remove the protective layer without affecting the surface of the substrate.

19. The method of claim 18, wherein the substrate is made from a material selected from the group consisting of Si, $Si_3N_4$, and $SiO_2$.

20. The method of claim 19, wherein the protective layer is made from a material selected from the group consisting of $SiO_2$, Ti, PVA, W, Al2O3, polyimide, and photoresist.

21. A method for deep etching features on a surface, the method comprising:
- providing a substrate having a surface selected to undergo a feature etching process; and
- coating the substrate surface with a protective layer and an imprintable layer, the imprintable layer selected to undergo an imprinting process and to protect selected portions of the substrate during the feature etching process, the protective layer disposed between the substrate and the imprintable layer, wherein the protective layer is configured to erode during the feature etching process such that the protective layer continues to cover the selected portions of the substrate after the feature etching process;
- coating the substrate with a magnetic layer subsequent to removing remaining portions of the protective layer; and
- wherein the imprintable layer is substantially removed subsequent to the feature etching process, wherein the protective layer remains covering the selected portions of the substrate subsequent to the feature etching process.

22. The method of claim 21, further comprising conducting the feature etching process.

23. The method of claim 21, wherein the feature etching process comprises a first etching episode selected to etch the protective layer and a second etching episode selected to etch the substrate.

24. The method of claim 21, further comprising removing exposed portions of the protective layer.

25. The method of claim 21, wherein the protective layer is made from a material selected from the group consisting of $SiO_2$, Ti, PVA, W, Al2O3, polyimide, and photoresist.

26. The method of claim 21, wherein a thickness of the protective layer is substantially determined by an equation $T_{pro}=R*S+BV*S$, wherein R is a rounding that occurs in the imprintable layer, BV is a residual layer variance of the imprintable layer, and S is an etch selectivity of the imprintable layer and the protective layer.

27. The method of claim 21, further comprising incorporating a patterned magnetic media formed by the method of claim 21 within a storage device.

28. The method of claim 21, further comprising completely removing remaining portions of the protective layer subsequent to conducting the feature etching process.

29. The method of claim 28, wherein the protective layer is removed by performing a removal process selected to remove the protective layer without affecting the surface of the substrate.

30. The method of claim 29, wherein the substrate is made from a material selected from the group consisting of Si, $Si_3N_4$, and $SiO_2$.

* * * * *